United States Patent
Watanabe

(10) Patent No.: US 9,691,762 B2
(45) Date of Patent: Jun. 27, 2017

(54) TRANSISTOR FOR AMPLIFYING A HIGH FREQUENCY SIGNAL

(71) Applicant: Mitsubishi Electric Corporation, Tokyo (JP)

(72) Inventor: Shinsuke Watanabe, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 15/016,764

(22) Filed: Feb. 5, 2016

(65) Prior Publication Data
US 2017/0018549 A1    Jan. 19, 2017

(30) Foreign Application Priority Data
Jul. 14, 2015 (JP) .................. 2015-140308

(51) Int. Cl.
| | | |
|---|---|---|
| H01L 27/10 | (2006.01) | |
| H01L 27/07 | (2006.01) | |
| H01L 23/535 | (2006.01) | |
| H01L 29/06 | (2006.01) | |
| H01L 29/417 | (2006.01) | |
| H01L 23/482 | (2006.01) | |

(52) U.S. Cl.
CPC ........ *H01L 27/0727* (2013.01); *H01L 23/482* (2013.01); *H01L 23/4824* (2013.01); *H01L 23/535* (2013.01); *H01L 29/0619* (2013.01); *H01L 29/41758* (2013.01); *H01L 29/41775* (2013.01); *H01L 2224/4912* (2013.01); *H01L 2224/49175* (2013.01)

(58) Field of Classification Search
CPC ........... H01L 27/0727; H01L 29/41758; H01L 2224/4912; H01L 2224/49175; H01L 29/41775
USPC .......................... 257/203, 207, 208, 341, 343
See application file for complete search history.

(56) References Cited

U.S. PATENT DOCUMENTS

| | | |
|---|---|---|
| 6,020,613 A | 2/2000 | Udomoto et al. |
| 2011/0068410 A1* | 3/2011 | Garnett ............... H01L 27/0629 257/379 |

FOREIGN PATENT DOCUMENTS

| | | |
|---|---|---|
| JP | 01_117368 A | 5/1989 |
| JP | 06_005636 A | 1/1994 |

* cited by examiner

*Primary Examiner* — Matthew E Warren
(74) *Attorney, Agent, or Firm* — Studebaker & Brackett PC

(57) ABSTRACT

A transistor includes: a semiconductor substrate; a plurality of gate electrodes, a plurality of source electrodes, and a plurality of drain electrodes on the semiconductor substrate; a drain pad on the semiconductor substrate and connected to the plurality of drain electrodes; a metal wiring on the semiconductor substrate and arranged spaced apart from, adjacent to and parallel to the drain pad; and a ground pad on the semiconductor substrate and connected to both ends of the metal wiring.

9 Claims, 2 Drawing Sheets

TRANSISTOR FOR AMPLIFYING A HIGH FREQUENCY SIGNAL

BACKGROUND OF THE INVENTION

Field of the Invention

The present invention relates to a transistor that amplifies a high frequency signal.

Background Art

A field-effect transistor (FET) includes a plurality of transistor cells which are connected in parallel to each other (e.g., see Japanese Patent Application Laid-Open No. 6-5636). This causes power outputted from the respective transistor cells to be combined, allowing the transistor as a whole to obtain large output power. Wires or probes to supply the output power to outside or apply a drain bias voltage to the transistor are connected to this drain pad.

FIG. 3 is a plan view illustrating a conventional transistor. A plurality of gate electrodes 2, a plurality of source electrodes 3, a plurality of drain electrodes 4, a gate pad 5, a source pad 6 and a drain pad 7 are formed on a semiconductor substrate 1. The gate pad 5 is connected to the plurality of gate electrodes 2, the source pad 6 is connected to the plurality of source electrodes 3, and the drain pad 7 is connected to the plurality of drain electrodes 4. A ground metal (not shown) is formed on the back side of the semiconductor substrate 1. A ground potential is applied to the source electrode 3 via the source pad 6 and a via hole 9 inside the semiconductor substrate 1.

It is generally known that resonance and oscillation can occur inside a transistor that combines a plurality of transistor cells. For example, when an electromagnetic field analysis is performed on the transistor in FIG. 3, it is predicted that resonance occurs at 17 GHz. When this resonance occurs, a standing wave of an electric field is generated right under the drain pad 7. That is, such a situation occurs that the intensity of the electric field directed from the drain pad 7 to the ground metal of the back side varies from one location to another of the drain pad 7. If the transistor has a sufficient gain at 17 GHz, an oscillation may occur at this frequency.

FIG. 4 is a plan view illustrating an improved conventional transistor. A resistor 13 is formed inside the drain pad 7 to suppress the above-described resonance and oscillation. When a resonance occurs inside the transistor and a standing wave of an electric field is generated right under the drain pad 7, an AC current that flows in the vertical direction is generated on the surface of the drain pad 7. An AC current also flows through the resistor 13 inside the drain pad 7 and electric energy of 17 GHz is converted to thermal energy. For this reason, loss is generated at 17 GHz and the oscillation is suppressed. On the other hand, if the frequency of a signal to be amplified is sufficiently low and each transistor cell 8 operates uniformly, the electric field right under the drain pad 7 has the same intensity regardless of the position. At this time, no current flows through the resistor 13. Therefore, performance never deteriorates at a desired frequency.

When the frequency of a signal to be amplified becomes higher, each transistor cell 8 may operate nonuniformly. In this case, if the resistor 13 is formed inside the drain pad 7, an AC current flows through the resistor 13. As a result, loss is generated also in the signal to be amplified and output power or power addition efficiency deteriorates. For this reason, there is a problem that the performance of the transistor deteriorates. Furthermore, in the case of a high output transistor, the resistor 13 may be damaged because an AC current that can flow through the resistor 13 when a nonuniform operation occurs is extremely large.

SUMMARY OF THE INVENTION

The present invention has been implemented to solve the above-described problems and it is an object of the present invention to provide a transistor capable of suppressing oscillation without deterioration of performance or damage to the resistance.

According to the present invention, a transistor includes: a semiconductor substrate; a plurality of gate electrodes, a plurality of source electrodes, and a plurality of drain electrodes on the semiconductor substrate; a drain pad on the semiconductor substrate and connected to the plurality of drain electrodes; a metal wiring on the semiconductor substrate and arranged spaced apart from, adjacent to and parallel to the drain pad; and a ground pad on the semiconductor substrate and connected to both ends of the metal wiring.

The present invention makes it possible to suppress oscillation without causing performance deterioration or damage to the resistor.

Other and further objects, features and advantages of the invention will appear more fully from the following description.

DETAILED DESCRIPTION OF THE PREFERRED EMBODIMENTS

A transistor according to the embodiments of the present invention will be described with reference to the drawings. The same components will be denoted by the same symbols, and the repeated description thereof may be omitted.

First Embodiment

Figure 1:
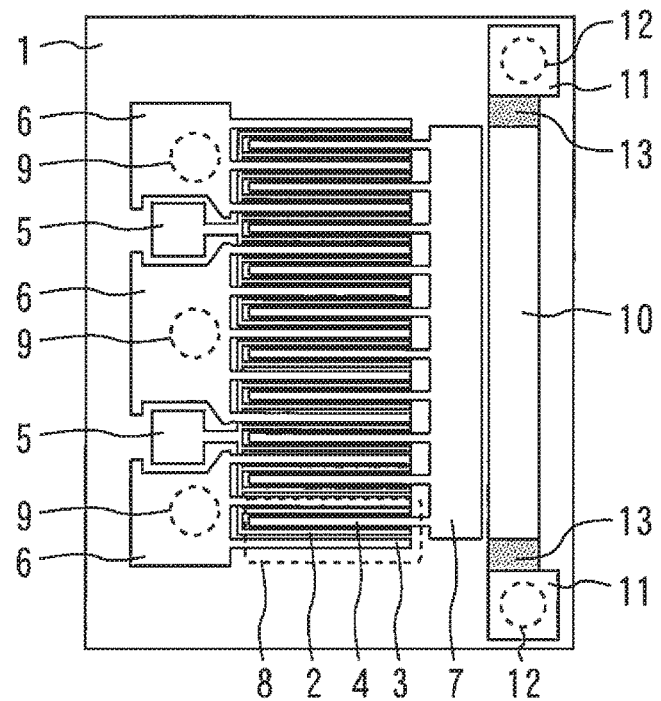
FIG. 1 is a plan view illustrating a transistor according to a first embodiment of the present invention.

FIG. 1 is a plan view illustrating a transistor according to a first embodiment of the present invention. This transistor is a field-effect transistor (FET).

A plurality of gate electrodes 2, a plurality of source electrodes 3, a plurality of drain electrodes 4, a gate pad 5, a source pad 6 and a drain pad 7 are formed on a semiconductor substrate 1. The gate pad 5 is connected to the plurality of gate electrodes 2, the source pad 6 is connected to the plurality of source electrodes 3, and the drain pad 7 is connected to the plurality of drain electrodes 4. The field-effect transistor is formed by connecting a plurality of transistor cells 8 in parallel. Each transistor cell 8 includes the gate electrode 2, the drain electrode 4 and the source electrode 3.

A ground metal (not shown) is formed on the back side of the semiconductor substrate 1. The source electrode 3 is connected to the ground metal on the back side of the substrate via a via hole 9 inside the semiconductor substrate 1 and the source pad 6, and a ground potential is applied thereto.

A metal wiring 10 is formed on the semiconductor substrate 1 and is arranged spaced apart from, adjacent to and parallel to the drain pad 7. The entire drain pad 7 faces the metal wiring 10 to constitute a capacitor. Note that the material of a conductor making up the metal wiring 10 is optional and may be the same type of material as the drain pad 7. A distance between the drain pad 7 and the metal wiring 10 is preferably 100 microns or less.

Ground pads 11 are formed on the semiconductor substrate 1 and connected to both ends of the metal wiring 10. The ground pads 11 are connected to the ground metal on the back side of the substrate through via holes 12 inside the semiconductor substrate 1 and a ground potential is applied thereto. A resistor 13 is connected between the metal wiring 10 and the ground pad 11. Wires and probes are connected to the drain pad 7 as in the case of the prior art.

Next, operation of the transistor according to the present embodiment will be described. A conductor in which resonance occurs may be electrically combined with another nearby conductor under an appropriate condition and may propagate electric energy to the nearby conductor. The drain pad 7 which is open at both ends in particular, is strongly combined with the metal wiring 10, both ends of which are short-circuited. Therefore, when a standing wave of an electric field is generated right under the drain pad 7, the metal wiring 10 adjacent to the drain pad 7, both ends of which are short-circuited can receive electric energy. The resistor 13 connected to the metal wiring 10 converts the received electric energy to thermal energy. Thus, the metal wiring 10, the ground pad 11 and the resistor 13 generate loss only at a resonance frequency and suppress oscillation inside the transistor.

On the other hand, no coupling occurs between the drain pad 7 and the metal wiring 10 at frequencies other than the resonance frequency, for example, a frequency of a signal to be amplified by the transistor. Therefore, no loss is generated in the metal wiring 10 or resistor 13, neither affecting the operation of the transistor nor causing performance deterioration of the transistor. In this case, no current flows through the resistor 13 which is not directly connected to the drain pad 7, and so the resistor 13 is not damaged either. Thus, the present embodiment can suppress oscillation without causing performance deterioration or damage to the resistor.

Here, even if the resonance frequency or oscillating frequency is unknown or if a predicted oscillating frequency is different from the actual one, the transistor according to the present embodiment operates appropriately. This is because the oscillating frequency is a frequency at which an electric field standing wave is generated in the drain pad 7 as described above, and the frequency at which an electric field standing wave is generated is a frequency at which the drain pad 7 is electrically connected with the metal wiring 10. Therefore, by forming the metal wiring 10, the ground pad 11 and the resistor 13, loss is automatically generated for only the resonance frequency or the oscillating frequency.

Note that the present embodiment uses the via hole 12 as a method of applying a ground potential to the ground pad 11, but other methods can also be used. For example, a ground potential may be applied using a wire or a probe. The type of the resistor 13 is optional, and an ion implantation resistor, a thin-film resistor or a fine wire resistor or the like can be used. Moreover, if the resistance component of the metal wiring 10 is high and the necessary amount of loss can be generated by only the metal wiring 10, the resistor 13 may not necessarily need to be formed.

Second Embodiment

Figure 2:
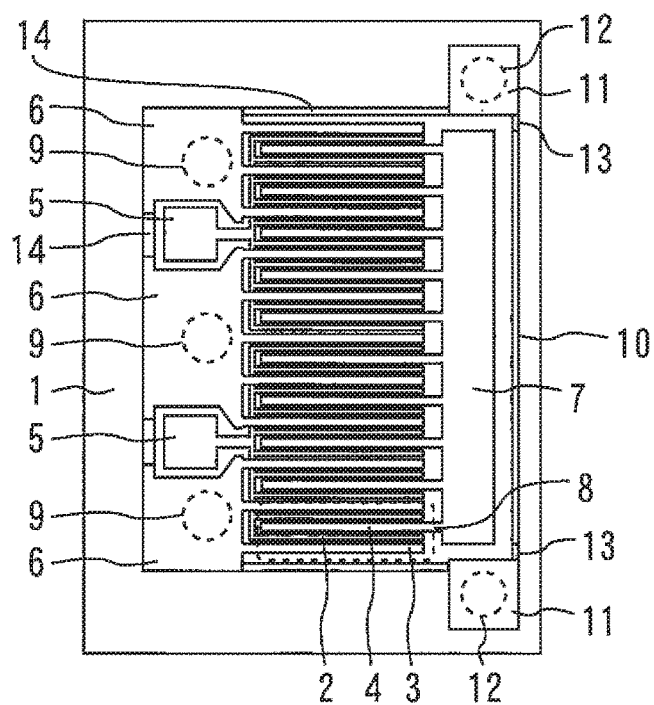
FIG. 2 is a plan view illustrating a transistor according to a second embodiment of the present invention.
Figure 3:
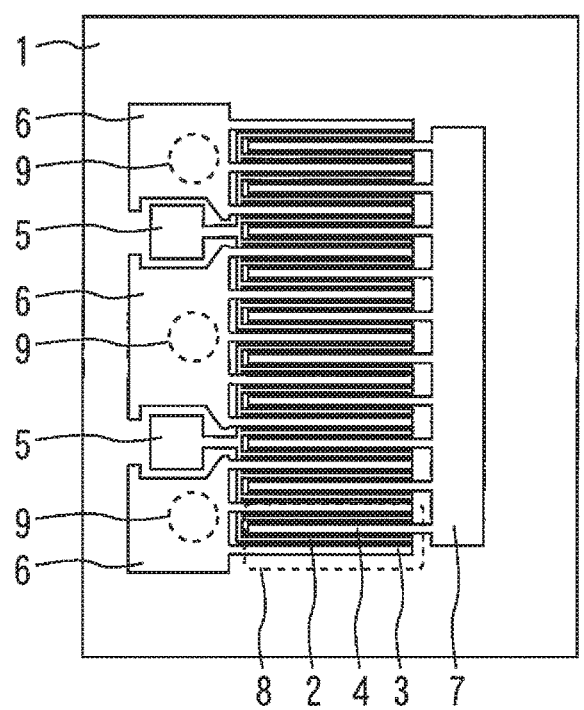
FIG. 3 is a plan view illustrating a conventional transistor.
Figure 4:
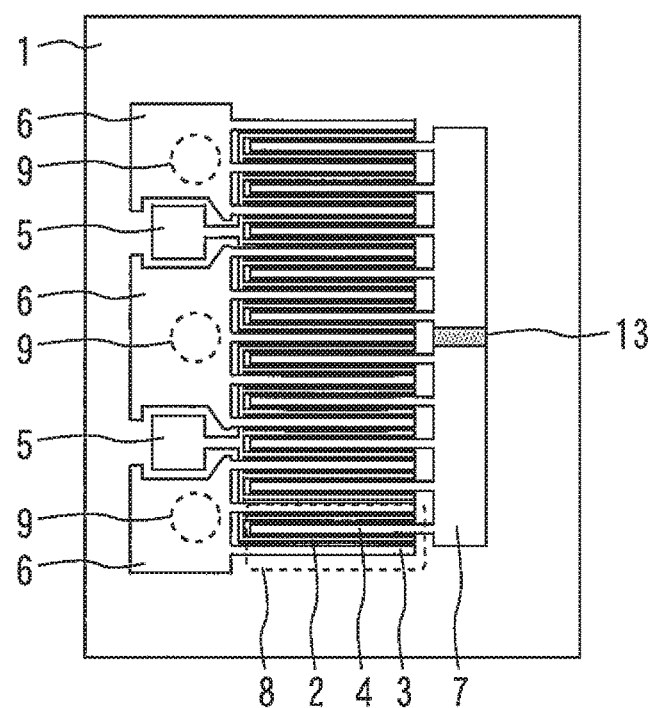
FIG. 4 is a plan view illustrating an improved conventional transistor.

FIG. 2 is a plan view illustrating a transistor according to a second embodiment of the present invention. For the purpose of reducing influences of noise from outside, a guard ring 14 that surrounds a plurality of gate electrodes 2, a plurality of source electrodes 3 and a plurality of drain electrodes 4 is formed on the semiconductor substrate 1. A ground potential is applied to the guard ring 14.

The metal wiring 10 forms a part of the guard ring 14. Thus, even when a metal wiring other than the metal wiring 10 is disposed on the ground pad 11, it is possible to obtain effects similar to those of the first embodiment. Furthermore, the metal wiring 10 and the guard ring 14 may be connected to another conductor to which a ground potential is applied, for example, the source pad 6.

To obtain the effects, however, the drain pad 7 needs to be electrically connected with the guard ring 14 at a resonance frequency. In order to transmit energy of the electric field standing wave generated in the drain pad 7 to the guard ring 14, the ground pad 11 needs to be formed adjacent to an end portion of the drain pad 7. The distance between the end portion of the drain pad 7 and the ground pad 11 is preferably 100 microns or less.

Obviously many modifications and variations of the present invention are possible in the light of the above teachings. It is therefore to be understood that within the scope of the appended claims the invention may be practiced otherwise than as specifically described.

The entire disclosure of Japanese Patent Application No. 2015-140308, filed on Jul. 14, 2015 including specification, claims, drawings and summary, on which the Convention priority of the present application is based, is incorporated herein by reference in its entirety.

What is claimed is:

1. A transistor comprising:
   a semiconductor substrate;
   a plurality of gate electrodes, a plurality of source electrodes, and a plurality of drain electrodes on the semiconductor substrate;
   a drain pad on the semiconductor substrate and connected to the plurality of drain electrodes;
   a metal wiring on the semiconductor substrate and arranged spaced apart from, adjacent to and parallel to the drain pad; and
   a ground pad on the semiconductor substrate and connected to both ends of the metal wiring,
   wherein the plurality of source electrodes and the ground pad are connected to a ground metal on a back side of the semiconductor substrate.

2. The transistor of claim 1, wherein the entire drain pad faces the metal wiring to constitute a capacitor.

3. The transistor of claim 1, wherein a ground potential is applied to the ground pad.

4. The transistor of claim 3, further comprising a wire or a via hole inside the semiconductor substrate, wherein the ground potential is applied to the ground pad using the wire or the via hole.

5. The transistor of claim 1, wherein a distance between the drain pad and the metal wiring is 100 microns or less.

6. The transistor of claim 1, further comprising a resistor connected between the metal wiring and the ground pad.

7. The transistor of claim 6, wherein the resistor is an ion implantation resistor, a film resistor or a wire resistor.

8. The transistor of claim 1, further comprising a guard ring on the semiconductor substrate and surrounding the plurality of gate electrodes, the plurality of source electrodes and the plurality of drain electrodes,
   wherein the metal wiring forms a part of the guard ring.

9. The transistor of claim 8, wherein a distance between an end portion of the drain pad and the ground pad is 100 microns or less.

\* \* \* \* \*